United States Patent [19]

Jurgensen et al.

[11] 4,400,730
[45] Aug. 23, 1983

[54] MULTIBURST SIGNAL GENERATION

[75] Inventors: David J. Jurgensen, Gaston; Howard A. Landsman, Beaverton, both of Oreg.

[73] Assignee: Tektronix, Inc., Beaverton, Oreg.

[21] Appl. No.: 227,868

[22] Filed: Jan. 23, 1981

Related U.S. Application Data

[63] Continuation of Ser. No. 945,730, Sep. 25, 1978, abandoned.

[51] Int. Cl.³ ............................................. H04N 7/02
[52] U.S. Cl. ...................................... 358/139; 358/10; 485/226; 331/20; 331/44; 331/55; 331/179; 328/188
[58] Field of Search ..................... 331/44, 55, 61, 168, 331/20, 21, 172, 179; 358/10, 139; 328/187, 188, 189; 322/27; 307/3; 455/226

[56] References Cited

U.S. PATENT DOCUMENTS

| 2,733,433 | 1/1956 | Morrison | 358/139 |
| 3,588,730 | 3/1952 | Johnson | 328/189 |
| 3,879,749 | 4/1975 | Baum | 358/10 |
| 3,965,424 | 6/1976 | Coackley | 455/226 |

FOREIGN PATENT DOCUMENTS

1429858 3/1973 United Kingdom .
1457747 12/1976 United Kingdom .

OTHER PUBLICATIONS

Winston H. Starks "Rainbow Generator" Jan.-1955, Radio-Electronics pp. 79-80.

*Primary Examiner*—Robert L. Griffin
*Assistant Examiner*—Edward L. Coles
*Attorney, Agent, or Firm*—John Smith-Hill; John D. Winkelman

[57] ABSTRACT

A multiburst test signal generator and a method for using the generator's test signal to determine the frequency response characteristics of television video circuits with a high degree of accuracy is described. One of the burst frequencies is continuously enabled and made variable and the other burst frequencies are disabled. The resulting continuous sine wave is applied to the circuit being tested, its frequency is varied, and the output of the circuit being tested is monitored with a conventional frequency counter.

9 Claims, 1 Drawing Figure

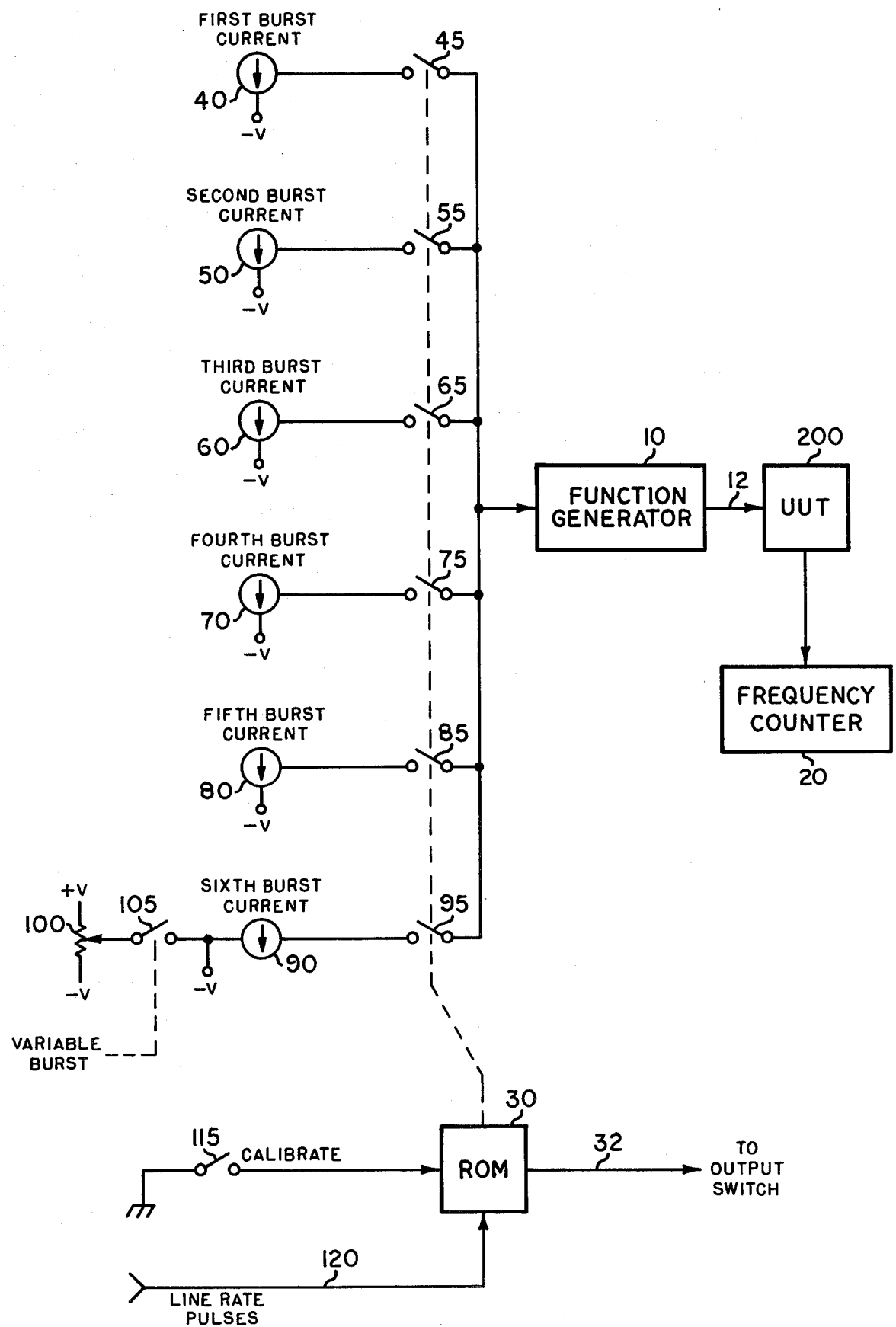

MULTIBURST SIGNAL GENERATION

CROSS-REFERENCE TO RELATED APPLICATION

This is a continuation of application Ser. No. 945,730, filed Sept. 25, 1978, now abandoned.

BACKGROUND OF THE INVENTION

There is a need in the television broadcasting field to test the frequency response of video circuits and systems. One frequently used method is to apply a video sweep signal to the input of the equipment being tested and observe the resulting output signal with an oscilloscope. This procedure cannot be used with equipment that requires the presence of synchronizing pulses, however. Another widely used method is to employ a multiburst signal generator—one that produces blanking pulses upon which sync pulses and various discrete bursts of video frequencies are superimposed. The multiburst signal, which for the NTSC color television system suitably includes a series of equal-amplitude bursts of sine wave signals ranging from 0.5 MHz to 4.2 MHz plus "black" and "white" reference levels, is applied to the input of the circuit or system under test. By observing the resultant output with an oscilloscope, the frequency response of the equipment may be determined visually based on how the different frequency bursts are affected.

One of the critical areas of frequency response for NTSC color television systems is the range of frequencies between the chrominance subcarrier (3.58 MHz) and intercarrier sound (4.5 MHz). Video circuitry must be carefully adjusted so that the video signal does not interfere with the sound signal. With prior art multiburst signal generators, this is done by observing the effect of equipment adjustments on the 4.2 MHz burst and estimating the resulting cut-off frequency of the video equipment. An improved, more accurate means for determining the frequency response characteristics of video equipment within a selected range, such that between the color subcarrier and intercarrier sound frequencies, is clearly desirable.

SUMMARY OF THE INVENTION

In accordance with a described embodiment of the present invention, an improved multiburst signal generator has one burst that can be varied in frequency over a wide range. In one operational mode, the generator produces a normal multiburst signal. In another mode, the generator is switched to provide a continuous sine wave signal variable in frequency over a predetermined range. Critical frequency response characteristics thus may be determined with improved accuracy by monitoring the variable frequency signal using a conventional frequency counter.

Further features, advantages and objects of the present invention will become evident as the following detailed description is read in conjunction with the accompanying drawing.

BRIEF DESCRIPTION OF THE DRAWING

The drawing shows in schematic form portions of a multiburst signal generator according to the preferred embodiment of the present invention.

DETAILED DESCRIPTION OF THE INVENTION

Referring now to the drawing, a multiburst generator provided according to the present invention is shown to include a function generator 10 for producing sine wave signals in response to current supplied by constant current sources 40-90. The multiburst generator shown in the drawing includes six current sources, one for each burst of sine waves in the generator's output waveform. Current sources 40-90 are connected to function generator 10 via switches 45-95, respectively. Each of the sources supplies current at a level necessary to cause the function generator to produce sine waves at a desired burst frequency. Operation of switches 45-95 is controlled by a read-only memory (ROM) 30 triggered by line rate pulses supplied via a line 120. During each television line, ROM 30 closes and opens each switch 45-95 in sequence to apply a pulse of current from each source to the function generator for a predetermined length of time. The current pulses cause generator 10 to produce six sine wave bursts—one at each of six different frequencies. These burst packets then are fed to an output circuit (not shown) where luminance information is added to the test waveform.

A multiburst generator for NTSC color television equipment testing typically produces sine wave bursts having the following fixed frequencies:
First Burst—0.5 MHz
Second Burst—1.5 MHz
Third Burst—2.0 MHz
Fourth Burst—3.0 MHz
Fifth Burst—3.58 MHz
Sixth Burst—4.2 MHz In the embodiment of the present invention shown in the drawing, the sixth burst is optionally variable in frequency to permit an accurate determination of equipment cut-off frequency in the region between the chrominance subcarrier and sound intercarrier frequencies. When the variable burst feature is not enabled, however, the generator operates in a conventional manner.

Referring to the drawing, current source 90 is connected via a variable burst switch 105 to a potentiometer 100. When switch 105 is closed, the potentiometer can be used to vary the voltage supplied to source 90, thus varying its output current and (when switch 95 is closed by ROM 30) the output frequency of function generator 10.

The variable frequency burst feature of the invention is operable in two modes—NORMAL and CALIBRATE—by means of a mode switch 115. When the mode switch is open as shown, ROM 30 activates switches 45-95 in sequence to produce five fixed-frequency bursts and a sixth, or last, burst that may be varied over a range of frequencies—3.6 MHz to 4.6 MHz, for example. The CALIBRATE mode is selected by closing switch 115, which causes ROM 30 to close switch 95 and hold switches 45-85 open. ROM 30 also disables, via a line 32, the output circuit that (among other things) adds the luminance signal to the multiburst waveform. As will thus be evident, function generator 10 produces a continuous sine wave at a frequency determined by the output current from source 90 when the multiburst generator is operated in CALIBRATE mode.

With variable burst switch 105 and mode switch 115 open, the improved multiburst generator of the invention may be used in a conventional manner to estimate the frequency response of video systems and circuits. If an accurate measurement of a test unit's cut-off frequency is required, switched 105 and 115 are closed to enable the variable burst feature of the generator in CALIBRATE mode. The output of function generator 10 is applied via line 12 to the unit under test (UUT) 200. A suitable frequency counter 20 is used to measure the frequency of signals passing through UUT 200. The frequency counter may be of conventional design, since the monitor signal is a continuous sine wave—i.e., not gated. The ability of UUT to pass signals of a particular frequency can be easily ascertained by varying the frequency of the test signal using potentioner 100. If UUT 200 requires the presence of a synchronizing pulse—i.e., it will not accept a continuous sine wave—mode switch 115 is opened to place the generator in NORMAL mode. As previously described, this results in the generation of a multiburst signal with five fixed-frequency bursts and one that is variable over a predetermined range via adjustment of potentiometer 100.

Although a preferred embodiment of the present invention has been shown and described in detail herein, it will be apparent to those of ordinary skill in the art that various changes and modifications may be made without departing from the invention in its broader aspects. For example, any or all of the burst frequencies could be made variable, if desired, according to specific testing requirements. The appended claims are thus intended to cover all such changes and modifications as are within the scope of the invention as defined by those claims.

We claim as our invention:

1. A signal generator adapted for testing video circuitry, comprising
   means for generating sine wave signals at a frequency dependent on a current level supplied thereto,
   means for supplying current to said generating means, said means being operable in a first mode to supply a plurality of different, discrete current levels in a repeating sequence, and in a second mode to supply a continuous, adjustable level current, and
   means for switching said current supplying means between said first and second modes.

2. The signal generator of claim 1, wherein said current supplying means includes a plurality of constant current sources.

3. The signal generator of claim 2, wherein said current supplying means includes means responsive to television line rate-related signals for enabling said plurality of current sources in a repeating sequence.

4. The signal generator of claim 3, wherein said enabling means comprises a read-only memory.

5. A multimode signal generator for testing television circuitry, said generator comprising a sine wave signal source operable in a first mode to produce, at a television line rate, a repetitive test signal that includes a plurality of sine wave bursts at different frequencies, and operable in a second mode to produce a continuous, variable frequency sine wave signal, said signal source including:
   means for generating sine wave signals at a frequency dependent on a current level supplied to said generating means, and
   means for supplying current to said generating means at a plurality of different current levels in a repeating sequence during operation in said first mode, and for supplying a continuous, adjustable current level to said generating means during operation in said second mode.

6. The signal generator of claim 5, wherein said source includes means for varying the frequency of at least one of said plurality of bursts during operation in said first mode.

7. The signal generator of claim 5, wherein said current supplying means comprises a plurality of constant current sources, and means for selectively connecting said sources to said sine wave generating means.

8. The signal generator of claim 7, wherein said selective connection means includes means responsive to television line rate-related signals for connecting said constant current sources to said sine wave generating means in a repeating sequence during operation in said first mode.

9. The signal generator of claim 7, wherein said selective connection means includes a plurality of switches controlled by a read-only memory unit.

* * * * *